US005698344A

United States Patent [19]
Bai et al.

[11] Patent Number: 5,698,344
[45] Date of Patent: Dec. 16, 1997

[54] TWO-STEP GATED HOLOGRAPHIC RECORDING IN PHOTOREFRACTIVE MATERIALS USING CW LASERS

[75] Inventors: Yu Sheng Bai; Ravinder Kachru, both of Redwood City, Calif.

[73] Assignee: SRI International, Menlo Park, Calif.

[21] Appl. No.: 815,550

[22] Filed: Mar. 12, 1997

Related U.S. Application Data

[63] Continuation of Ser. No. 562,213, Nov. 28, 1995, abandoned.

[51] Int. Cl.$^6$ .................................................... G03H 1/04
[52] U.S. Cl. ............................ 430/1; 430/2; 430/290; 359/7; 359/3; 363/117
[58] Field of Search ............................ 430/1, 2, 290, 430/945; 359/1, 3, 4, 7, 35; 363/117

[56] References Cited

U.S. PATENT DOCUMENTS

| | | | |
|---|---|---|---|
| 3,997,350 | 12/1976 | Ikeo et al. | 430/1 |
| 4,052,119 | 10/1977 | Williams et al. | 430/1 |
| 4,187,109 | 2/1980 | Megumi et al. | 430/2 |
| 4,339,513 | 7/1982 | Alvarez et al. | 430/1 |
| 4,505,536 | 3/1985 | Huignard et al. | 350/3.64 |
| 4,728,165 | 3/1988 | Powell et al. | 350/3.64 |
| 4,927,220 | 5/1990 | Hesselink et al. | 350/3.64 |
| 4,953,924 | 9/1990 | Redfield et al. | 350/3.64 |
| 5,491,570 | 2/1996 | Rakuljik et al. | 359/7 |

OTHER PUBLICATIONS

Alphonse et al. RCA Review 37(2) (Jun. 1976) pp. 184–205.

Grum et al. "Optical Radiation Measurements" (©1979) pp. 147–149.

Svelto "Principles or Lasers" (©1989) pp. 280, 281, 373.

Russu, Antonio N., Vauthey, Eric, Wie, Changjiang, and Wild, Urs P., "Photon–Gated Holography: Triphenylene in a Boric Acid Glass," pp. 10496–10503, J. Phys. Chem., 1991.

Linde, D. von der, Glass, A. M., and Rodgers, K. F., "Optical Storage Using Refractive Index Changes Induced by Two–Step Excitation," Journal of Applied Physics, vol. 47, No. 1, Jan. 1976.

"The Physics of Optical Recording," pp. 96 to 110, K–Schwartz, Springer–Verlog, 1993.

Linde, D. von der, Glass, A. M., and Rodgers, K. F., "Multiphoton Photorefractive Processes for Optical Storage in LiNbO$_3$," pp. 155–157, Applied Physics Letters, vol. 25, No. 3, Aug. 1, 1974.

Linde, D. von der, Glass, A.M., and Rodgers, K. F., "High–Sensitivity Optical Recording in KTN by Two–Photon Absorption," pp. 22–24, Applied Physics Letters, vol. 26, No. 1, Jan. 1, 1975.

Vormann, H. and Kratzig, E., "Two Step Excitation in LiTaO3:Fe for Optical Data Storage," Solid State Communications, vol. 49, No. 9, pp. 843–847, 1984.

(List continued on next page.)

Primary Examiner—Martin Angebranndt
Attorney, Agent, or Firm—Hickman Beyer & Weaver, LLP

[57] ABSTRACT

Ferroelectric materials are disclosed as reversible holographic recording media (25) for use in two-photon recording systems. The ferroelectric materials disclosed herein provide long-lived electronic states intermediate the ferroelectric material's valence and conduction bands. These intermediate states have a sufficiently long life (on the order of 1 to 100 milliseconds) that low-power continuous wave ("cw") lasers (1) can be used to record interference patterns on them. Thus, two-photon holographic recording systems are also disclosed which do not require high-power, short pulse length, mode-locked or Q-switched lasers. Rather, the disclosed holographic recording systems employ visible and near IR cw lasers such as diode lasers.

The disclosed two-photon holographic recording systems provide for absorption of a first photon which excites electrons of holographic recording media to an intermediate state. Thereafter, upon absorption of a second photon, the electrons are promoted to the media's conduction band where they are arranged according to the interference pattern provided by the recording system.

22 Claims, 4 Drawing Sheets

OTHER PUBLICATIONS

MacFarlane, Roger, M., "Optical Spectroscopy of Photorefractive materials for holographic storage applications," Abstract MB1, Supplement to Optics & Photonics News, Jul. 1995.

Buse, K., Holtmann, L. and Kratzig, E., "Activation of $BaTiO_3$ for Infrared Holographic Recording," pp. 183–186, Elsevier Science Publishers B.V., 1991.

Sweeney, K. L., Halliburton, L.E., "Oxygen Vacancies in Lithium Niobate," pp. 336–338, American Institute of Physics, Aug. 15, 1983.

Ming, Ye, Kratzig, E., and Orlowski, R., "Photorefractive Effects in $LiNbOa:Cr$ Induced by Two–Step Excitation," Phys. Stat. Sol, (a) 1985. vol. 92.

Hanna, D.C., Tropper, A.C., and Large, A.C., "Optical Absorption and Luminescence of $Tm^{3+}$–doped $LiNbO_3$ and $LiNbO_3$ (MgO) Crystals," Journal of Luminescence, 55, pp. 253–263, 1993.

Zhang, Guilan, Ying, Xiaoying, Yao, Leming, Chen, Ting, and Chen, Huanchu, "Spectroscopic investigation of $Pr^{3+}$ Luminescence in $Sr_xBa_{1-x}Nb_2O_6$ Crystal," Journal of Luminescence, 59, pp. 315–320, 1994.

Johnson, L.F. and Ballman, A.A., "Coherent Emission from Rare–Earth Ions in Electro–Optic Crystals," Journal of Applied Physics, vol. 40, No. 1, pp. 297–302, Jan. 1969.

Winnacker, A., Shelby, R.M., and Macfarlane, R.M., "Photon–Gated Hole Burning: A New Mechanism Using Two–Step Photoionization," Optics Letters, vol. 10, No. 7, Jul. 1985.

Bjorklund, G.C., Burland, D.M., and Alverez, D.C., "A Holographic Technique for Investigating Photochemical Reactions," pp. 4321–4328, J. Chem. Phys., 73(9), Nov. 1, 1980.

TWO-STEP GATED HOLOGRAPHIC RECORDING IN PHOTOREFRACTIVE MATERIALS USING CW LASERS

This is a continuation of application Ser. No. 08/562,213 filed Nov. 28, 1995, now abandoned.

This invention was made with government support under agreement number MDA972-94-2-0008 (ARPA Order No. A576) awarded by the Advanced Research Projects Agency. The government has certain rights in this invention.

DESCRIPTION

1. Technical Field

This invention relates to holographic recording media. More particularly, the invention relates to holographic recording media including poled single crystal ferroelectric materials.

2. Background Art

Holographic recording systems hold forth the promise of very high data storage densities and parallel recording and reading capabilities. It was recognized by the early 1960s that holographic recording media could, in theory, provide a much greater data storage density than magnetic recording media and other conventional recording media. Such high densities are attributable, in part, to the holographic storage media's ability to store information in three dimensions. Thus, the theoretical storage capacity for a volume hologram varies approximately as media volume divided by the cube of the recording wavelength ($V/\lambda^3$). So, for a wavelength of 500 nanometers, the storage capacity for a volume hologram is on the order of $10^{12}$ to $10^{13}$ bits/cm$^3$, compared to $10^8$ bits/cm$^2$ for two-dimensional optical storage media, such as CD-ROMs.

In holographic recording systems, a source of monochromatic coherent radiation is split into (1) an "object beam" which is spatially modulated by a two-dimensional grid (or data source) containing the information to be recorded, and (2) a "reference beam" which is unmodulated. These two beams are then directed onto a single region of a holographic recording medium, where they interact to generate an interference pattern. The holographic recording medium is made from a light sensitive material that records the resulting interference pattern, and thereby stores the information provided on the grid. An image of the recorded information can be constructed from the recorded interference pattern by illuminating the medium with a "read beam." The read beam will have the same characteristics as the reference beam used to record the hologram. Ferroelectric materials have been investigated as potential holographic recording media because they can maintain electric dipole domains, even in the absence of an applied electric field. In such materials, incident radiation from an optical interference pattern promotes electrons from illuminated areas to a conduction band where they diffuse away from the illuminated areas. Some of these mobile electrons fall from the conduction band back into stationary traps. The electrons in the illuminated areas continue to be promoted to the conduction band at a much greater rate than the electrons in the dark areas. Thus, during illumination, the concentration of electrons gradually increases in the dark areas and gradually decreases in the light areas. When the radiation interference pattern is removed, the electrons are no longer promoted to the conduction band by radiation, but do remain trapped at the same spatial locations that they assumed during illumination. Thus, the ferroelectric material can record an optical interference pattern in the form of a spatial distribution of electrons. In some ferroelectric materials (sometimes referred to as "photorefractive" materials), this spatial distribution of electrons causes a corresponding spatial distribution in refractive index which can be read by directing a read beam onto the recorded ferroelectric material as mentioned above.

In some materials, the charge carriers responsible for the photorefractive effect described above are mobile "holes" excited to the valence band by the laser light. For simplicity, the remaining discussion is limited to electrons. However, it should be understood that the phenomena described herein can be extended to holes in straight forward manner.

Ferroelectrics are particularly attractive holographic storage media because they can be reversibly recorded; i.e., they can be erased and rerecorded many times. Many competing holographic recording media store information only irreversibly in the manner of a CD-ROM.

Unfortunately, ferroelectric materials often can be too easily erased—particularly during the process of reading the recorded interference pattern. As mentioned, to read the recorded medium, radiation must be directed onto it. And the reading radiation must be of the same wavelength as the radiation used to record the data image. Thus, the photon energy of the read beam will cause some of the electrons in the ferroelectric recording medium to reenter the conduction band (just as they did during recording) where they diffuse to a uniform distribution, thereby erasing the interference pattern.

In an effort to overcome this problem, it has been proposed to use a "two-photon" recording procedure, so named because it requires two photons to excite an electron to the ferroelectric's conduction band. It has been shown that two-photon recording can be accomplished by illuminating the ferroelectric with a "gating" beam at one wavelength and a read/write beam at a second wavelength. See, for example, D. von der Linde et al., "Multiphoton photorefractive processes for optical storage in LiNbO$_3$," Appl. Phys. Lett. 25, 155 (1974). The two wavelengths are chosen such that photons at both wavelengths have insufficient energy, by themselves, to promote electrons to the conduction band. However, the sum of the photon energies for the two wavelengths is sufficient to promote electrons to the conduction band. In application, a first photon excites an electron to an "intermediate" electronic state close to the conduction band. Then while the electron is temporarily residing in such intermediate energy state, a second photon (typically of a different wavelength than the first wavelength) promotes it to the conduction band where it diffuses and becomes trapped to record the interference pattern as described above.

This two-photon process provides a more stable hologram than the previously-described "single-photon" process in which only a single photon is required to promote an electron into the conduction band. In single-photon systems, the photons provided by the read beam promote the electrons making up the recorded interference pattern to the conduction band where they redistribute themselves and thereby erase the stored information. In the two-photon recording systems, however, the read beam will have an intensity and photon energy chosen to make single-photon promotion impossible and two-photon promotion unlikely. Thus, a holographic recording medium recorded by a two-photon process can be read many times without erasure.

It was realized early on that the two-photon process reliance on an intermediate energy state below the conduction band posed its own problem. Without special treatment of the ferroelectric recording medium, such states were extremely short lived. As such, the light sources required to promote electrons to the conduction band would have be of extremely high power (at least on the order of a gigawatt/cm$^2$) and therefore of extremely short pulse duration (on the order of 10 picoseconds). Such constraints would be unworkable for commercial systems. To enhance the two-photon transition probability and thereby relax these constraints, subsequent work employed ferroelectric materials doped with transition metal ions (e.g., iron, chromium, and copper ions). Such ions provided relatively long-lived intermediate electronic states (typically on the order of 100 nanoseconds) close to the ferroelectric's conduction band.

While two-photon recording procedures relying upon such doped ferroelectrics have been recognized as an advance in the march toward a commercial holographic recording system, they still require a light source having an unacceptably high power and short pulse length. In U.S. Pat. No. 3,922,061 issued to Glass et al.—which describes some of the early work on two-photon recording—it is stated that such light source should be a mode-locked or Q-switched laser having "a minimum peak intensity of 1 megawatt/cm$^2$". The patent further suggests that for some two-photon systems, lasers of 10 to 100 gigawatt/cm$^2$ may be required (see column 9, lines 1–12). Unfortunately, such power requirements coupled with mode-locking or Q-switching are incompatible with a low cost, reliable storage system.

Very recently, it has been proposed to use ferroelectric materials doped with rare earth metal ions having 4f excited states that give rise to absorptions in the near infra-red and visible spectral regions (e.g., praseodymium, neodymium, and thulium ions). Such ions provide significantly longer-lived intermediate electronic states (typically on the order of 0.1 to 1 millisecond) than the transition metal ions used in previous systems. This allowed two-photon holographic recording to be accomplished with inexpensive low power continuous wave ("cw") lasers such as diode lasers. Thus, commercial reversible holographic recording systems may now be within reach. Holographic recording systems employing such rare earth doped ferroelectric materials are described in U.S. patent application Ser. No. 08/538,704 (Attorney docket no. SRI1P009/P3554), filed on Oct. 3, 1995, naming Bai et al. as inventors, and entitled "GATED RECORDING OF HOLOGRAMS USING RARE-EARTH DOPED FERROELECTRIC MATERIALS." That application is incorporated herein by reference in its entirety and for all purposes.

While the rare earth doped ferroelectrics may become important holographic recording media, other recording media might also be useful, particularly media that could efficiently record at a wide range of laser wavelengths. It should be recognized that to attain optimal recording efficiency in a doped ferroelectric recording medium, one of the two photon sources should be provided at a wavelength in resonance with an electronic transition in the dopant atom. This is not always practical, as inexpensive laser sources generally produce radiation only at discreet wavelengths that are not necessarily in resonance with available dopant ion transitions.

Thus, it would be desirable to provide a reversible holographic recording system that can efficiently record at wavelengths provided with various types of continuous wave lasers.

DISCLOSURE OF THE INVENTION

To meet this need, and take advantage of an observed property of certain ferroelectrics, the present invention provides a holographic recording system that employs a continuous wave laser for reading from and writing to a ferroelectric recording medium. Unlike the doped ferroelectric media described above, the ferroelectric medium of this invention contains, at most, a very low concentration of optically active impurities (i.e., impurities such as transition metals or rare earth metals which have electronic transitions in resonance with the wavelength of the continuous wave laser). Preferably, the ferroelectric material contains defects or other features that provide long-lived intermediate states on the order of 1 to 100 milliseconds. It has been observed that such intermediate states can be used in two-photon recording processes employing a continuous wave laser producing radiation of an intensity less than about 1000 W/cm$^2$. Further, it has been observed that, in many cases, such intermediate states allow recording with radiation over a wide range of wavelengths in the visible and infrared electromagnetic spectral regions. Thus, the present invention can be practiced without requiring a laser that produces radiation of a wavelength in resonance with a narrow absorption peak of a dopant atom.

In the systems of this invention, like other two-photon recording systems, absorption of a first photon excites electrons of the recording medium to an intermediate state. Thereafter, upon absorption of a second photon, the electrons are promoted to the medium's conduction band where they diffuse before becoming trapped in an arrangement corresponding to the interference pattern provided by the recording system. Unlike most prior two-photon systems, the first and second photons can be provided by low-power commercially available cw lasers such as the type used in commercially available optical systems such as CD readers.

In one aspect, the present invention provides a holographic recording system that can be characterized as including the following elements: (1) a holographic recording medium including a ferroelectric material that contains no more than about 0.01% atomic of an optically active impurity; (2) a first radiation source for providing coherent monochromatic radiation which is first divided into a reference beam and a spatially modulated object beam and then recombined to form an interference pattern on a first region of the holographic recording medium; and (3) a second radiation source for providing a gating beam which is optically coupled to a second region of the holographic recording medium. The first and second regions of the recording medium should be at least partially coextensive with one another. Further, the first and second radiation sources should be chosen so that their respective photons together promote electrons of the holographic recording media to a conduction band by a two-photon process. In this manner, the system records the interference pattern in the holographic recording medium. In general, one of the radiation sources should be chosen to produce radiation of a frequency that promotes electrons to the recording medium's intermediate levels.

Many variations on this basic theme may be provided. For example, in some cases radiation from the first and second radiation sources will have the same wavelength. In such cases, the two-photons necessary to promote an electron to the conduction band may be provided by a single radiation source—i.e., the first and second radiation sources are the same. This is known as a "one-color two-photon" system. More commonly, two different radiation sources ("two colors") will be employed: one of which provides the object and reference beams, and the other of which provides photons used exclusively to promote electrons to the conduction band (the gating beam). In preferred embodiments, the gating beam will have a shorter wavelength than the reference/object beam. This makes erasure more difficult during subsequent read operations—which employ relatively low energy photons at the reference beam wavelength.

Preferably, the first radiation source is a continuous wave laser (as opposed to a more expensive Q-switched or mode-locked laser) having a power density of less than about 1000 W/cm$^2$ and more preferably in range of 20 to 200 W/cm$^2$. Further, the first radiation source preferably produces radiation in the visible or near infrared regions of the electromagnetic spectrum. In especially preferred embodiments, the first radiation source is a diode laser. The second radiation source may be either a laser or an incoherent radiation source. In the latter case, it may require a filter to block high energy photons that would promote electrons to the conduction band by a single photon.

In preferred embodiments, the ferroelectric recording media contains no more than about 100 parts per million (on a per mole basis), and more preferably no more than about 10 part per million, of any optically active extrinsic impurity. Suitable ferroelectric materials for use with the present invention include lithium niobate, potassium lithium niobate, lithium tantalate, barium titanate, strontium barium niobate (SBN), lead barium niobate (PBN), and barium strontium potassium sodium niobate (BSKNN). Preferably, the ferroelectric has been processed to introduce defects which produce long-lived intermediate states. Such processing may include subjecting the ferroelectric to a reduction process to introduce oxygen vacancies. Alternatively, defects can be introduced by doping with an optically inactive dopant.

In another aspect, the present invention provides a method of writing to a holographic recording medium (a ferroelectric material containing no more than about 0.01% atomic of an optically active impurity). Such method can be characterized as including the following steps: (1) separating a first radiation beam of a first wavelength into a reference beam and a spatially modulated object beam; (2) combining the reference beam and the spatially modulated object beam to form an interference pattern on a first region of the holographic recording medium; and (3) directing a gating radiation beam containing at least a second wavelength onto a second region at least partially coextensive with the first region of the holographic recording medium. Photons of the first and second wavelengths together promote electrons of the holographic recording media to a conduction band by a two-photon process such that the interference pattern is recorded in the holographic recording medium. In general, the character of the recording media and the gating, reference, and object beams used in this method are as described above in the context of the system aspect of this invention.

The methods of this invention allow for angular and frequency, and phase multiplexing. In angular multiplexing, the step of combining the reference beam and the spatially modulated object beam to form an interference pattern is conducted at a defined first angle with respect to the recording medium. Thereafter, the reference beam and a second spatially modulated object beam are combined at a second defined angle, different from the first defined angle, to form a second interference pattern which is recorded on the holographic recording medium. In this manner two or more "slices" of two-dimensional data are recorded at slightly different angles on the same holographic recording medium.

In frequency multiplexing, the method includes steps of (1) separating a third radiation beam of a third wavelength, different from the first wavelength, into a second reference beam and a second spatially modulated object beam; and (2) combining the second reference beam and the second spatially modulated object beam on the holographic recording medium. This is done in a manner that produces an interference pattern of radiation from the third radiation beam that is recorded in the holographic recording medium together with the interference pattern of the first radiation beam.

In phase multiplexing, the reference beam is spatially phase modulated as compared to the spatially uniform reference bean used in the above two methods. In general, a set of orthogonal phase codes can be constructed so that the total number of the objects recorded in a medium can be equal to the number of phase codes. A detailed discussion can be found in U.S. Pat. No. 3,612,641 by C. C. Eaglerfield which is incorporated herein by reference for all purposes.

These and other features and advantages of the present invention will be presented in more detail in the following detailed description of the invention and the associated figures.

BEST MODES FOR CARRYING OUT THE INVENTION

1. Holographic Recording

Figure 1:
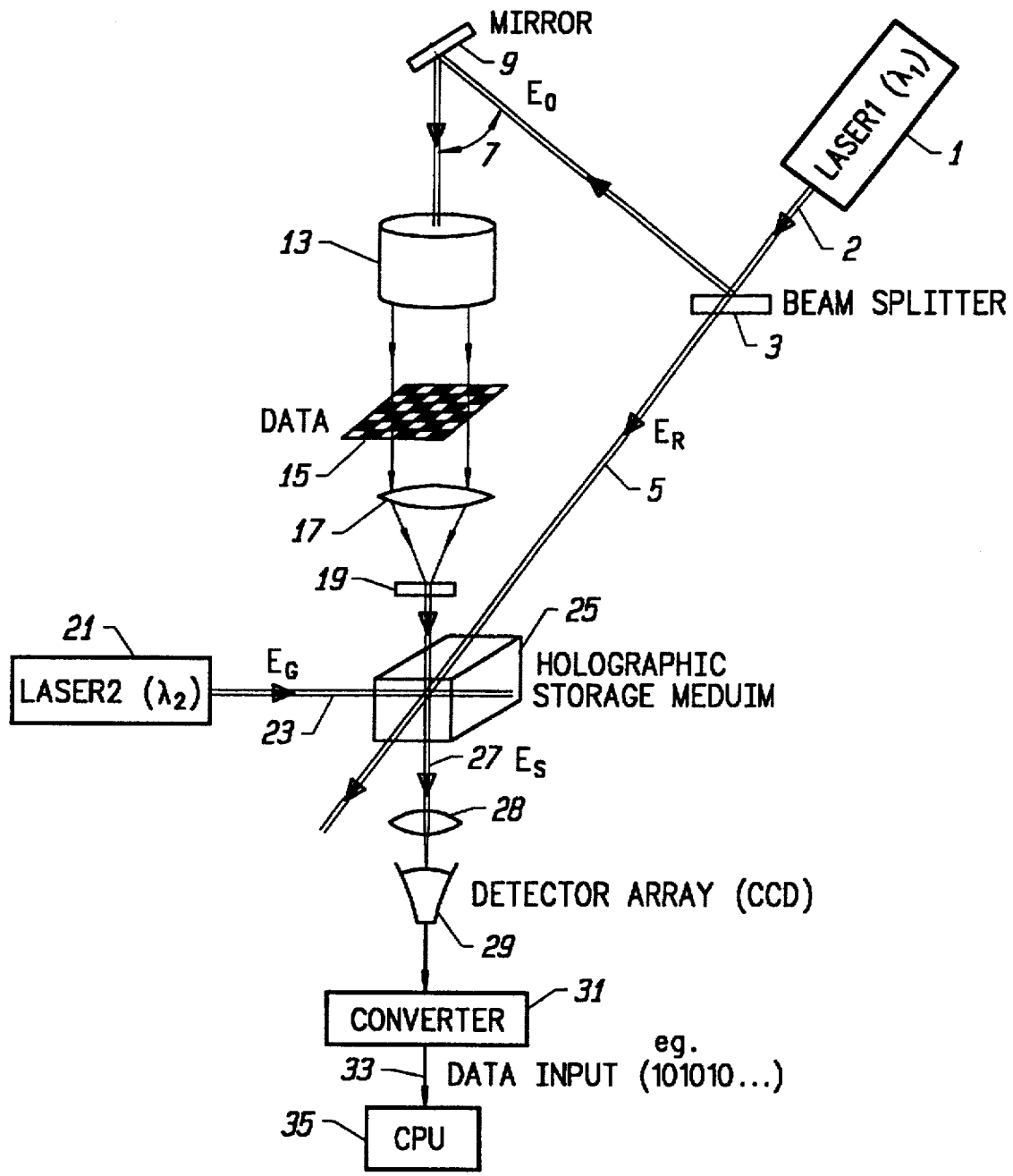
FIG. 1 is a schematic representation of holographic storage apparatus to read and write information on a holographic storage medium in accordance with this invention.

FIG. 1 presents a preferred holographic data recording apparatus of this invention, such as may be used with a high speed computer. A first coherent light source 1 puts out a beam of monochromatic light 2 of a first wavelength ($\lambda_1$). The beam of monochromatic light 2 is made incident on a beam splitter 3 which reflects approximately half of the monochromatic light to form an object beam ($E_O$) 7 and passes the remainder of the monochromatic light to form a reference beam ($E_R$) 5. The object beam 7 may be directed through various optical elements, such as, for example, a beam expanding element 13, and then towards a representation of data to be stored 15, shown in this illustration as a two-dimensional sheet of alternating spaces of light and dark meant to represent a page of binary information. The object beam 7, which is scattered from the data representation 15, is collected and recollimated by a second set of optical elements, such as, for example, a second lens system, represented here by a second single lens 17, and a deflector element 19. The scattered object beam 7 now contains the information in data representation 15 in the form of amplitude and phase variations with respect to the reference beam 5.

Although the data object is shown as a two-dimensional sheet 15 of binary information in FIG. 1, holographic data storage systems are not, in general, so limited. For example, the information to be stored may be analog as well as digital: although digital information will be appropriate for most current computing applications. In addition, the object to be recorded may take many forms—each of which spatially modulates incident radiation to produce the object beam. Such spatial modulators are conventional in the art and include, for example, liquid crystal modulators, electro-optic modulators, magneto-optic modulators, and acousto-optic modulators. Such modulators are discussed in "The Physics of Optical Recording" by K. Schwartz, Springer-Verlag, 1993 which is incorporated herein by reference for all purposes.

Both the object beam 7 and the reference beam 5 are made incident on a holographic storage medium 25 and interact so as to create an interference pattern in the storage medium. The holographic storage medium 25 comprises a ferroelectric material containing at most low concentrations of optically active impurities as described in more detail below. A second (unmodulated) light beam, known as a gating beam ($E_G$) 23, of a second wavelength ($\lambda_2$) not equal to $\lambda_1$ and preferably less than $\lambda_1$, from a second light source 21 is directed simultaneously onto the storage medium 25 with the object beam 7 and reference beam 5. A photon of light with wavelength $\lambda_2$ provides enough energy to excite an electron in the storage medium from a low lying defect state to an intermediate state closer to the medium's conduction band, but not enough energy for an electron to directly enter the conduction band. Then a photon of light with wavelength $\lambda_1$ provides the electron in the intermediate state with enough energy to enter the ferroelectric material's conduction band, where it can move from the regions of high light intensity and become trapped in the regions of low intensity. After the illumination from the first and/or second light beams is removed, and electrons are no longer optically promoted to the conduction band, and thus remain spatially trapped in the ferroelectric material, thereby creating a local electric field within the ferroelectric material which leads to an induced refractive index change similar to the spatial variations of intensity produced by the interference pattern. As noted, this phenomenon is sometimes referred to as the photorefractive effect. It should be understood that holographic recording may also be effected by an analogous mechanism in which holes (positive mobile charge carriers) are excited to a ferroelectric's valence band where such holes move away from the incident radiation.

In some preferred embodiments, in contrast to the above-described embodiment, photons from the reference and object beams 5 and 7 will excite electrons to the intermediate states, and the gating beam 23 photons will then promote the excited electrons to the conduction band. Either way, $\lambda_2$ and $\lambda_1$ should be chosen in conjunction with the ferroelectric material so that neither $\lambda_2$ and $\lambda_1$ can, by itself, promote an electron to the ferroelectric's conduction band, but the sum of the photon energies at the two wavelengths is sufficient to promote an electron to the conduction band. In especially preferred embodiments, at least the object/reference beam can be produced by a commercially available semiconductor laser. That is, first coherent light source 1 is a semiconductor laser.

To ensure that a meaningful interference pattern is produced, the object and reference beams should be phase locked. Thus, these beams generally should be produced by a single coherent laser radiation source. Suitable lasers for producing the object and reference beams in accordance with this invention include semiconductor lasers, argon ion lasers, Nd:YAG lasers, etc. In especially preferred embodiments, the laser wavelength is in the red or near infrared region of 620 to 1000 nm. In general, such lasers may be operated at relatively low intensities For example, it has been found that the ferroelectric materials used with this invention require a threshold intensity of about 1000 W/cm$^2$ to effect the transition. More preferably, the laser intensity employed in this invention will be between about 20 and 200 W/cm$^2$. This is well within the realm of currently available diode lasers, such as those used in compact disc players and laser printers, which can emit several hundred milliwatts of coherent, cw-near infra-red and visible radiation. The ability to use small diode lasers represents a significant advance towards the commercial feasibility of holographic date storage.

While the object and reference beams should be monochromatic and coherent, the gating beam need not be. Thus, the gating beam need not be produced by a laser and need not even be monochromatic. In general, the gating beam source need only produce radiation in a wavelength range which will assist the promotion of electrons into the conduction band by a two-photon mechanism (in conjunction with radiation from the object and reference beams). However, the gating beam should not include wavelengths which tend to promote electrons to the conduction band by a single photon mechanism. Thus, it may be necessary to block some of the gating beam's shorter wavelength photons from striking the recording medium (by, e.g., a notch filter).

The optimal gating beam wavelength will vary depending upon the band gap size of the ferroelectric recording medium. In especially preferred embodiments, the maximum gating beam wavelength has a photon energy of between about 0.5 and 0.75 times the band gap energy. By way of example, a 515 nm gating beam will be suitable for use with lithium niobate recording media and a 630 nm gating beam will be suitable for use with strontium barium niobate recording media.

As noted, the intermediate states of the ferroelectric recording media will have a defined lifetime. Thus, it is important that in pulsed recording systems, the write beam pulse follow the gating beam pulse (or vice versa) within a time frame defined by the lifetime of the intermediate state. For example, it has been found that some ferroelectric materials provide intermediate state lifetimes of about 30–50 milliseconds. Thus, the gating beam pulse should precede the write beam pulse by no more than 30–50 milliseconds (assuming that the gating beam is used to promote electrons to the intermediate level).

In preferred embodiments, the gating beam intensity should be at most about 500 W/cm$^2$. More preferably, the intensity should be between about 5 and 200 W/cm$^2$, and most preferably between about 10 and 100 W/cm$^2$. Further, the gating beam intensity will typically be between about 0.1 and 1 times the reference/object beam intensity. Suitable gating beam sources include, for example, xenon lamps, halogen lamps, argon ion lasers, Nd:YAG lasers, etc. As noted, it may be necessary in some cases to filter the radiation from these sources to meet the above constraints.

Various modifications may be made to the above system without departing from the scope of this invention. For example in some embodiments, a single light source may be employed as a source of the object, reference, and gating beams, such that $\lambda_2=\lambda_1$. Such systems, sometimes referred to as "one color, two-photon" systems, can have the general arrangement as shown in FIG. 1, but without the use of second radiation source 21. Of course, the photon energy in such systems must be below the energy required to directly promote electrons into the conduction band on its own. Further, the beam used to record the hologram should generally have a higher intensity than the beam used to read the hologram. This reduces the likelihood of promoting electrons to the conduction band during reading—and thereby erasing the hologram. It should be noted that such one-color two-photon systems of this invention resist erasure far better than comparable one-color single photon systems. This is because the erasure rate during reading is proportional to intensity in single photon systems and is proportional to intensity squared in two photon systems. Thus, reducing the read beam intensity (in comparison to the write beam intensity) in two photon systems reduces erasure rate much more dramatically than in single photon systems.

In another alternative embodiment, not shown, a reference beam, an object beam, and a gating beam are all generated by a first coherent light source of a first wavelength. The gating beam is produced by passing radiation from the first light source through a frequency doubler. Some fraction of the radiation exiting the frequency doubler will have a wavelength that is one-half that of the first wavelength. This short wavelength radiation serves as the gating beam which passes with the reference or object beam through appropriate optics and onto the holographic recording media. Preferably, the radiation exiting the frequency doubler will be directed onto a beam splitter that transmits both components and reflects only one. The reflected monochromatic portion then forms the object beam, and the transmitted component forms the reference beam (long wavelength) and gating beam (short wavelength).

Returning again to FIG. 1, the stored information can be read by blocking the object beam 7 and scattering off of the recorded interference pattern the reference beam 5 or its equivalent in terms of wavelength and angle of incidence with the storage medium 25. This scattering creates a scattered beam ($E_S$) 27 which passes through a lens 28 to produce an holographic image of the data representation which then is captured by a detector array 29 such as a charge-coupled device (CCD). Output from the detector array can be converted 31 into a serial binary form 33 suitable to input into standard computer central processing units 35. It should be noted that the reading process is inherently parallel. That is, the individual bits of data (in the case of a digital recording) are all read simultaneously and provided as a two-dimensional array. In conventional single CPU computing systems, the information in this array typically must be at least partially serialized for use with the computer. However, in more advanced parallel processing computer systems, there may be no need to serialize the data image. In fact, holographic storage media should be very efficient memory devices for massively parallel computers.

Figure 2:
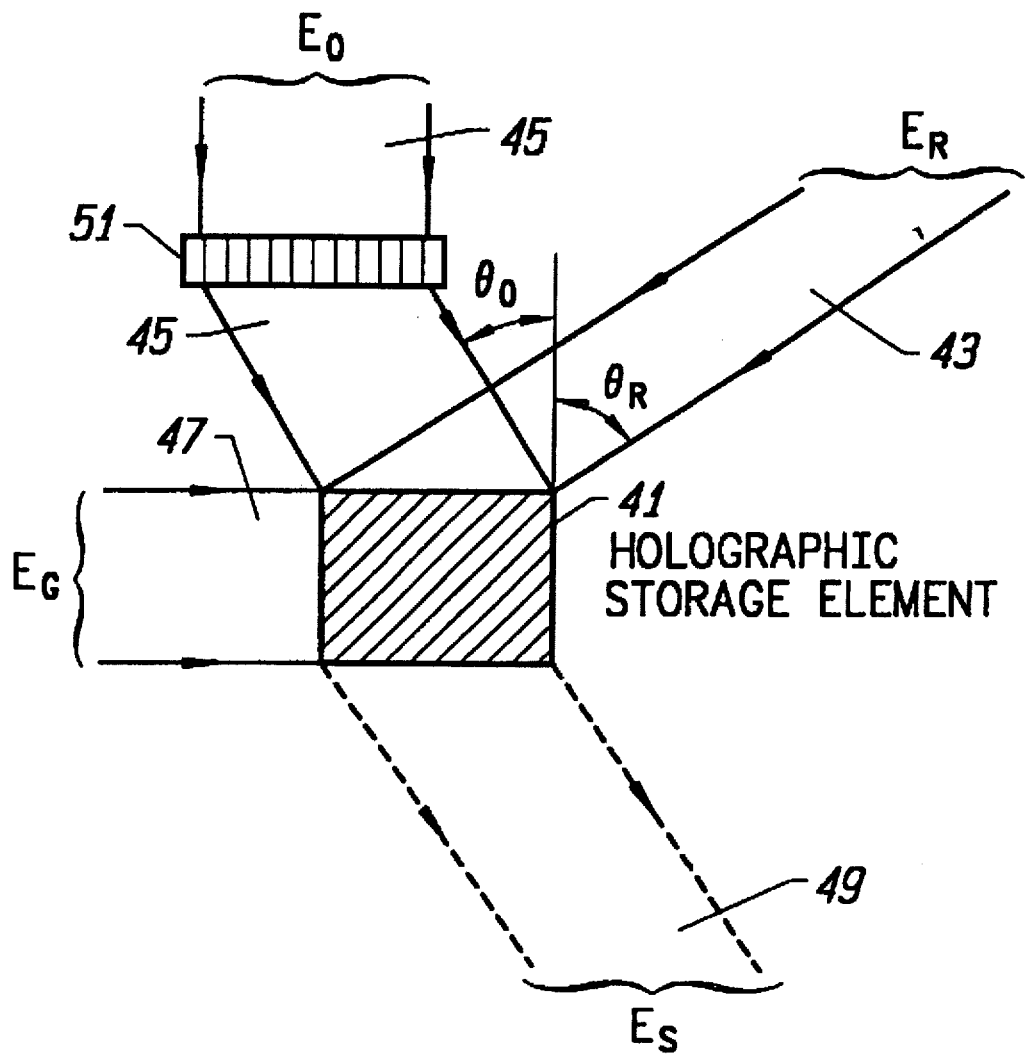
FIG. 2 is a schematic representation of an object, reference, and gating beam incident on a holographic storage element during a writing process in accordance with the invention, and a scattered beam which would result during a reading process.

The systems of this invention may be used to record volume holograms. Such holograms include various "slices" of recorded information overlapping one another within the recording medium. Typically, the various slices of information are each recorded at a different angle by a process known as angular multiplexing. As illustrated in FIG. 2, angular multiplexing is accomplished by storing multiple images within a given recording medium volume by varying the angles of incidence, $\theta_O$ and $\theta_R$ of an object beam 45 and a reference beam 43, respectively, on a holographic storage medium 41. $\theta_O$ and $\theta_R$ may be controlled by any number of means. A deflector element 51, for example, can be used to control the angle at which the object beam 45 (or the reference beam, not shown) is incident on the storage medium. Alternatively, the orientation of the storage medium could be manipulated to vary $\theta_O$ and $\theta_R$, not shown. The angular resolution of a volume hologram, which determines the number of holograms that can be accommodated in the medium, increases with the thickness of the storage medium. To attain good angular resolution, the thickness of a volume holographic recording medium should be on the order of 0.1 to 1 cm.

In addition to angular multiplexing, a technique known as frequency multiplexing may be used to record multiple interference gratings in a single holographic recording medium. Frequency multiplexing allows the gratings to be overlaid on one another by storing separate data representations at different wavelengths. Thus, a first data representation can be stored on a holographic recording medium using reference and object beams of one wavelength, and a second data representation can be stored on top of the first data representation using reference and object beams of a different wavelength.

Another technique known as phase multiplexing may also be used to record multiple interference patterns in a single medium. In this technique, the reference beam is spatially phase modulated with a set of specially designed orthogonal phase codes so that an interference pattern recorded using a reference beam with a particular code can be read out only by the same reference beam. A detailed discussion can be found in U.S. Pat. No 3,612,641 by C. C. Eaglerfield, which was previously incorporated by reference.

A holographic recording prepared in accordance with this invention may be erased by exposing the recording medium to photons having an energy sufficient to promote electrons to the medium's conduction band. Preferably, the radiation will be sufficiently intense that the erasure process can be completed in a short time. For most ferroelectrics (at least those having a band gap of 4 eV or less), intense ultraviolet radiation will serve this purpose. Often, however, an intense focused white light source will be sufficient to erase the recording medium. Further in cases where the gating radiation wavelength is significantly shorter than the read/write beam wavelength, a high intensity gating beam itself may actually be used to erase recorded data. After a medium is erased, it can, of course, be rerecorded in the manner described above.

2. Holographic Storage Media: Ferroelectrics with Long-lived Intermediate States The holographic recording media of this invention are, as noted, made from photorefractive ferroelectric materials. As used herein, the term "ferroelectric" generally refers to crystals exhibiting an electric dipole moment even in the absence of an external electric field. Thus, in the ferroelectric state, the center of positive charge of a crystal does not coincide with the center of negative charge. Further, a plot of polarization versus electric field for the ferroelectric state shows a hysteresis loop. A crystal in a normal dielectric state usually does not show significant hysteresis when the electric field is slowly increased and then reversed.

Suitable photorefractive, ferroelectric materials for use in the recording media of this invention include (1) perovskites such as $BaTiO_3$, $CaTiO_3$, $KNbO_3$, and $KTa_xNb_{1-x}O_3$; (2) oxides such as $LiNbO_3$, $LiTaO_3$; (3) complex oxides with a tungsten bronze structure such as $Sr_xBa_{1-x}Nb_2O_6$ (SBN) (4) non-oxide sulfur iodides such as SbSI, SbSeI, and BiSI; (5) bismuth germanium compounds such as $Bi_{12}GeO_{20}$ and $Bi_{12}SiO_{20}$; and (6) PLZT ceramics such as PbLaZrTi. Examples of preferred photorefractive ferroelectrics include lithium niobate, potassium lithium niobate, lithium tantalate, barium titanate, strontium barium niobate (SBN), lead barium niobate (PBN), and barium strontium potassium sodium niobate (BSKNN). Within this group, the compounds strontium barium niobate, barium titanate, and lithium niobate have been found to perform quite well.

Generally, the ferroelectric recording medium should contain no more than about 0.01% atomic of an optically active impurity. More preferably, the recording medium should contain no more than about 100 parts per million (per mole basis), more preferably no more than about 10 part per million, and most preferably no more than about 1 part per million of an optically active impurity. Thus, an important feature of the present invention is that the ferroelectric recording media remains undoped by an optically active impurity. An optically active impurity is an impurity that tends to absorb either the gating beam radiation, the read/write beam radiation or both. Such impurities should be avoided because they absorb radiation that could otherwise be used to promote electrons to the ferroelectric's conduction band.

It has been surprisingly observed that some such undoped ferroelectric materials support intermediate states with long lifetimes between about 1 and 100 milliseconds. For comparison, transition metal elements such as iron and copper provide intermediate electronic state life times on the order of about 0.1 microseconds and rare earth elements such as praseodymium provide intermediate electronic state life times on the order of about 0.1 to 1 microseconds. It has also been observed that the intermediate states in ferroelectrics of this invention give rise to absorptions over a wide spectral range in the near infra-red and visible spectral regions (e.g., between about 400 and 1550 nanometers). While not wishing to be bound by theory, it is believed that such intermediate states are attributable to defects in the ferroelectric crystal lattice that may result from atomic vacancies in the lattice, impurities, etc.

Ferroelectric single crystals suitable for use with this invention can be prepared according to conventional methods known in the art or can be custom made by certain vendors such as Virgo Optics of Port Richey, Fla., Deltronic Crystal Industries, Inc. of Dover N.J., and Fujien Caatech Crystals, Inc. of Fuzhou, Fujian Peoples Republic of China. Depending upon the nature of the material, growth may be by deposition from the vapor phase (e.g., sputtering, evaporation, ablation, chemical vapor deposition), by bulk process, such as by melt growth, from flux, etc. In general, melt growth involves fusing inorganic components in the correct ratios to form the ferroelectric and then pulling a single crystal from the melt. Such techniques are described in, for example, "Development and modification of photorefractive properties in the tungsten bronze family crystals" by Neurgaonkar in Optical Engineering, Vol. 26, pg. 392 et seq., May 1987 which is incorporated herein by reference for all purposes.

To increase the number of long-lived intermediate states in ferroelectric crystalline lattices, the ferroelectric can be specially processed. For example, to increase the number of atomic vacancies, the lattice may be bombarded with a particle beam or an X-ray beam. This will kick out some atoms in the lattice and thereby introduce vacancy defects. In oxygen containing ferroelectrics, vacancies may also be introduced by subjecting a sample to reducing conditions such as a high temperature anneal in a vacuum or inert atmosphere (e.g., an argon atmosphere). Preferably, the anneal is conducted at a temperature of between about 300° and 1000° C. (but not above a phase transition) for between about 0.1 and 1 hours. It has been reported that such annealing can indeed affect the absorption properties of ferroelectrics. See Sweeney et al., "Oxygen Vacancies in Lithium Niobate" Appl. Phys. Lett. 43 (4), pp. 336–338 (1983) which is incorporated herein by reference for all purposes.

Defects may also be introduced by doping the ferroelectric material with optically inactive dopant atoms such as certain transition metals. Such dopant atoms should be of a size and chemical nature to locally disrupt the lattice structure, and thereby introduce defects. Further, the dopant atoms should not absorb radiation at the wavelength of the read/write beam.

The thickness of the holographic recording media should be at least several times $\lambda$, where $\lambda$ is the wavelength of the radiation used to generate the interference pattern. In further preferred embodiments, the holographic recording media will have a thickness of between about 0.1 and 10 millimeters. In the example set forth below, it was found that holographic recording media having dimensions of 5 millimeters by 5 millimeters by 5 millimeters performed quite well.

Further, the recording medium should be coated with an anti-reflective material such as is employed to coat lens. Such materials include, for example, magnesium fluoride, magnesium oxide, and beryllium oxide. In general, such anti-reflective coatings should be provided on all sides of the holographic recording medium through which radiation will pass. Typically, it will be convenient and desirable to coat all outer surfaces of the medium.

Still further, it will generally be necessary to pole the single crystal ferroelectric recording medium before recording a grating on it. Conventional poling may be carried out generally by use of an applied electric field maintained during cooling of a material through its Curie point to some lower temperature is described in Ferroelectrics, 4, 189 (1972).

3. EXAMPLES

The first two examples below involved experiments performed on a 0.5×0.5×0.5 cm sample of single-crystal lithium niobate ($LiNbO_3$) supplied by Deltronic Crystal Industries of Dover, N.J. Chemical analysis of the sample showed all major transition metal impurities to be below 1 part per million. The sample was poled to a single domain by the supplier.

Example 1 (One-Color Two-Photon Recording)

Figure 3A:
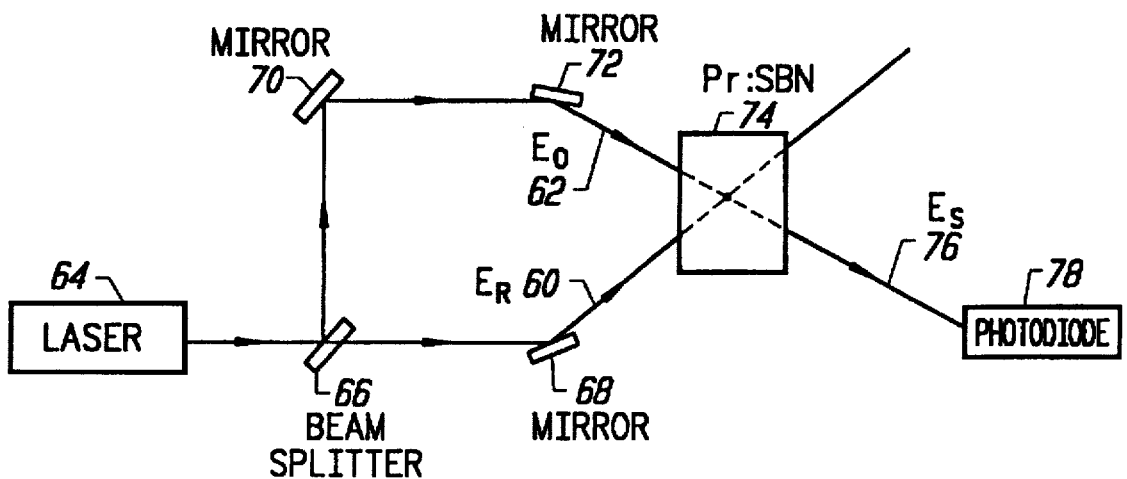
FIG. 3a is a block representation of the experimental setup used for one-color/two-photon experiments discussed below.

For these experiments, output from a laser 64 was split by a beam splitter 66 (reflectance=50%) to produce a reference laser beam ($E_R$) 60 and an object laser beam ($E_O$) 62, as shown schematically in FIG. 3a. These beams were then recombined to cross in the poled single-crystal sample of $LiNbO_3$ 74 at an angle of approximately 5° where they produced an interference pattern. Specifically, the object beam 62 was reflected off of mirrors 70 and 72 and thereby directed onto sample 74, while the reference beam 60 was reflected off of mirror 68 and thereby directed onto sample 74. The c-axis of the sample was oriented in parallel with the two transmitting surfaces of the sample and was in the polarization plane of the object and reference beams The holographic grating was written with a single one second laser pulse from laser 64 at a power density of about 2 W/mm². The grating was read by blocking the object beam 62 so that only the reference beam 60 would be incident on the sample and diffracted by the holographic grating to produce a scattered beam ($E_S$) 76. Thus, the holographic grating was read with continuous radiation from laser 64 at about one-half the laser intensity of the recording laser beams. A silicon photodiode 78 (EG&G Model. FND-100) was used to monitor the intensity of the diffracted beam. The diffraction efficiency was deduced as $\eta = |E_S/E_O|^2$. After all measurements necessary to deduce $\eta$ were completed, radiation from a halogen lamp was focused on the sample to erase the gratings and allow reuse.

The above-described reading and writing steps were conducted at a series of wavelengths. A tunable ring-dye laser (Coherent Model 699-21) with a wavelength range of 580 to 650 nm was used in experiments conducted at 580 nm, 600 nm, 620 nm, and 650 nm. A tunable Ti:sapphire laser (Coherent 899-01) was used in experiments conducted at 690 nm, 720 nm, 755 nm, 795 nm, 835 nm, 875 nm, 915 nm, and 995 nm.

It was found that for wavelengths of at least about 620 nm, the diffraction efficiency $\eta$ is proportional to the fourth power of laser power density (i.e., $\eta \propto I^4$). This is consistent with a two-photon process. It was also found that for wavelengths from 580 to 620 nm, the diffraction efficiency $\eta$ is proportional to $I^{2.5 \text{ to } 3.5}$. This suggests a mixture of one and two-photon processes ($\eta \propto I^2$ for one-photon processes). Thus, longer wavelengths (in the region of 620 nm or greater) can likely be used in holographic recording systems of this invention without causing rapid erasure during reading.

For fixed laser power densities, the efficiency $\eta$ was found to fall exponentially with wavelength at wavelengths greater than about 620 nm. This is illustrated in a plot of diffraction efficiency versus laser wavelength for a one-color process (curve 120) in FIG. 4. The data shown in this plot were taken with laser beams having a power density of 2 W/mm² and a pulse length of 1 second. As can be seen, at wavelengths of at least about 795 nm (and power densities of 2 W/mm²), the efficiency $\eta$ was less than $10^{-6}$, which is comparable to the scattering from background radiation.

Example 2 (Two-Color Two-Photon Recording)

Figure 3B:
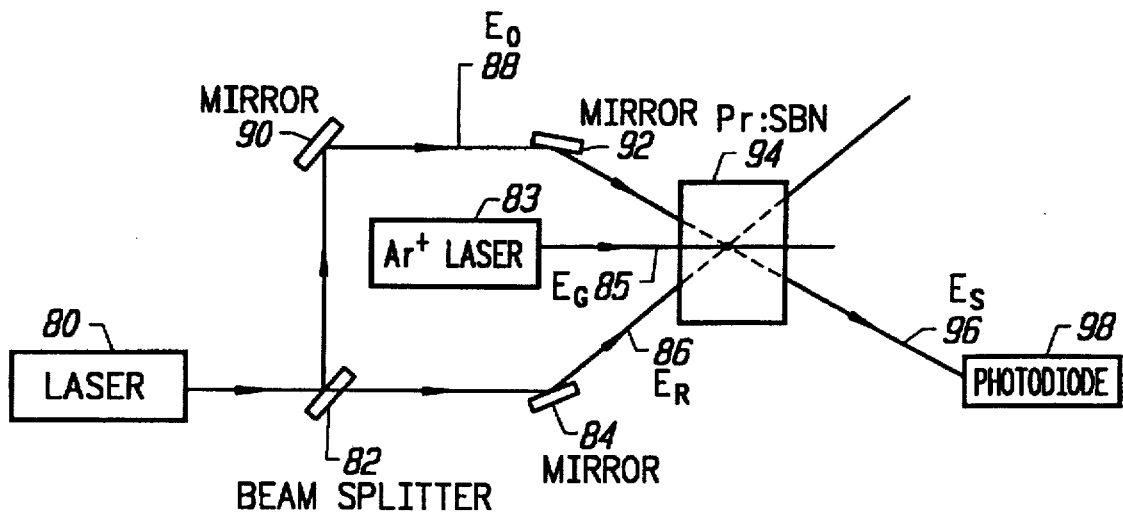
FIG. 3b is a block representation of the experimental setup used for two-color/two-photon experiments discussed below.

In two-color experiments, the experimental apparatus was essentially identical to that used in the one-color experiments, except that second laser 83 was employed to produce a gating beam ($E_G$) 85. Specifically, as shown schematically in FIG. 3b, the experimental apparatus employed an unmodulated gating laser beam ($E_G$) 85 which was directed on a poled single-crystal LiNbO₃ sample 94 simultaneously with an object ($E_O$) 88 and a reference ($E_R$) 86 beam to write the grating in the sample material. The object ($E_O$) 88 and reference ($E_R$) 86 beams were provided from a tunable laser 80 whose beam was split by a beam splitter 82. The object beam 88 was reflected off mirrors 90 and 92 and onto sample 94. The reference beam 86 was reflected off mirror 84 and onto sample 94. The gating beam 85 was the 514.5 nm fixed-wavelength output of an argon ion laser 83 (Coherent Model 200) polarized perpendicular to the c-axis of the LiNbO₃ sample. It had a diameter of about 0.2 millimeter and a power density of about 0.8 W/mm². As in the one-color experiments, the grating was read by blocking the object beam 88 so that only the reference beam 86 would be incident on the sample and diffracted by the holographic grating to produce a scattered beam ($E_S$) 96. The intensity of beam 96 was measured by a silicon photodiode 98.

As in the one-color experiments, the reading and writing steps were conducted at a series of wavelengths with a tunable ring-dye laser and a tunable Ti:sapphire laser. In each case, the diffraction efficiency $\eta$ was measured. A plot B versus wavelength for the two-color experiments is shown as curve 126 in FIG. 4. As before, the grating was recorded with a single one second pulse from laser beams (object 88 and reference 86 beams) having a power density of 2 W/mm². The gating beam ($E_G$) 85 was also provided as a one second pulse at a power density of 0.8 W/mm² as mentioned above. The writing and gating pulses were provided simultaneously.

Figure 4:
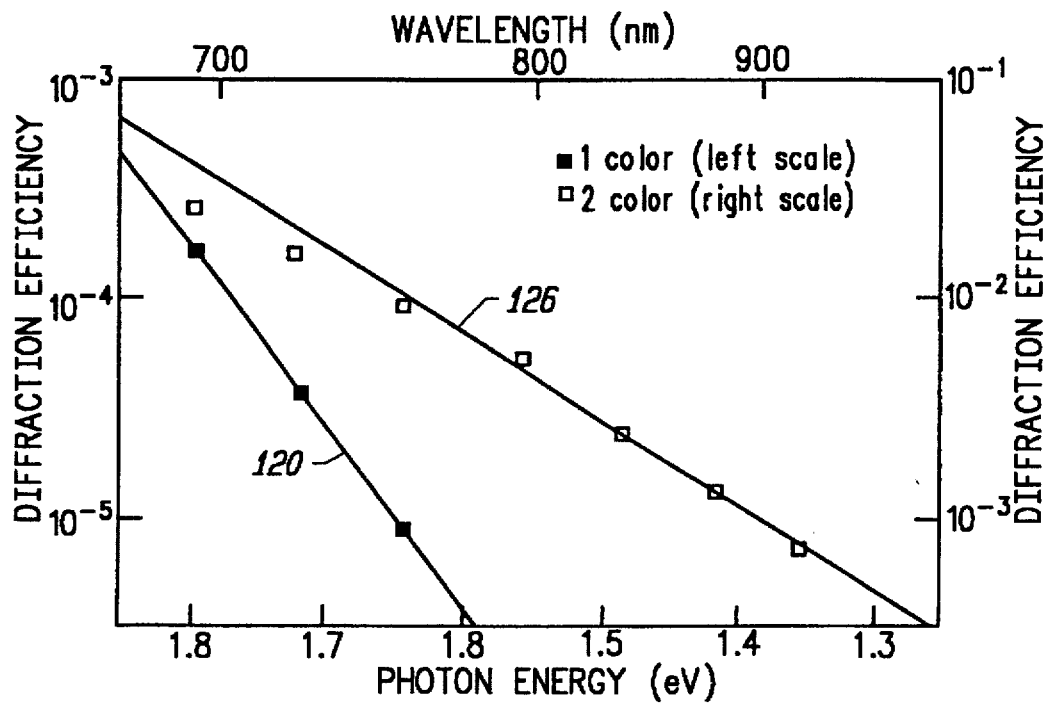
FIG. 4 is a graph comparing the diffraction efficiency of a hologram versus read/write beam wavelength for holograms recorded in one-color and two-color experiments.

The gating beam provides high energy photons used to promote electrons to intermediate states close to the conduction band. Some electrons residing in these intermediate states are then promoted into the conduction band by photons from the writing beam. In a one color situation, in contrast, the writing beam must promote the electrons first to the intermediate states and then to the conduction band. Thus, in a two-color process, electrons are more efficiently fixed (with regard to the writing beam intensity) in the recorded interference pattern, so that the signal strength in the diffracted intensity ($I_s$) is improved. Evidence of this is seen in FIG. 4 which shows the diffraction efficiency $\eta$ from the two-color experiment to be 1000 times greater than that from the one-color experiment at 755 nm (for the object and reference beams). Further, the enhancement factor (defined as ratio of the diffraction efficiency with the gating beam and without the gating beam) grew from 1 at 580 nm to 1000 at 755 nm.

In the two-color experiments, like the one-color experiments, the diffraction efficiency $\eta$ was found to decrease with wavelength. As shown in FIG. 4, curve 126, the decrease was exponential with a rate about one-half that of the one-color case.

The erasure rate of holograms recorded by two-color experiments was determined as follows. For holograms recorded at 755 nm with the assistance of the 514.5 nm gating beam under the same conditions as described above, the diffraction efficiency $\eta$ retained 60% of its original value after 30 minutes of reading (under the reading conditions described above). Further, a gated recording made at 835 nm retained 94% of its original diffraction efficiency after 20 minutes. A much more rapid erasure is expected for a one-photon recording process. For example, it can be shown by straight forward calculation that for holograms recorded at 755 nm under the same conditions, but without a gating beam, the diffraction efficiency $\eta$ would drop to 60% of its initial value after only 5.3 seconds of reading. Thus, the gated grating written at 755 nm as described above should be 340 times more resistant to erasure from reading than the ungated grating. This assumes that for the ideal one-photon process, the grating build up is exponential (i.e., $\eta_{writing}(t) = (1 - e^{-\beta/t})^2$) and that the grating erasure is also exponential (i.e., $\eta_{erasure}(t) = \eta_0 (e^{-\beta/t})^2$).

Figure 5:
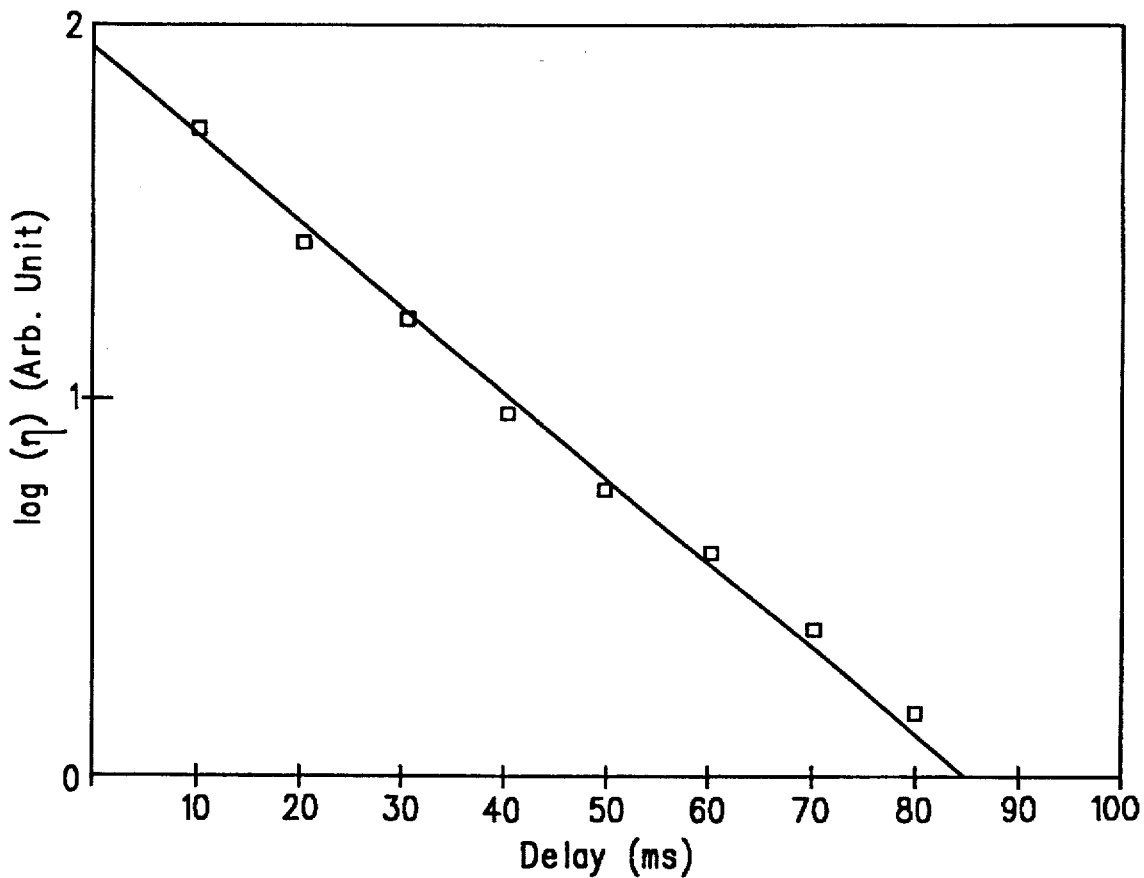
FIG. 5 is a graph showing how the diffraction efficiency of a two-photon, two-color holographic recording decreases with increasing delay between a writing pulse and a gating pulse.

As noted, two-photon recording at low powers (e.g., in the neighborhood of 1000 W/cm² or lower) requires a ferroelectric material having long lived intermediate states. Such states were confirmed by the formation of gated gratings at low write laser powers as described above. The lifetime of these intermediate states was determined as follows. The writing beams and the gating beam were chopped to 10 millisecond pulses and the resulting diffraction efficiency $\eta$ was measured as a function of the delay of the writing pulses from the gating pulses. As shown in FIG. 5, between delays of about 10 to 80 milliseconds, the diffraction efficiency η decreases dramatically, implying an intermediate level lifetime of between about 30 and 50 milliseconds (assuming that η is proportional to $(\exp(-t/\tau_o))^2$ where $\tau_o$ is the intermediate level lifetime).

Example 3

Further one and two-color experiments were performed with undoped and poled 60%-strontium, 40%-barium niobate ($Sr_{0.6}Ba_{0.4}Nb_2O_6$; also known as SBN:60), a ferroelectric material hereinafter referred to as SBN. The SBN sample used in these experiments was supplied by Deltronic Crystal Industries of Dover, N.J.

The grating measurements obtained with the SBN were essentially the same as those obtained with the $LiNbO_3$ crystal. However, because the SBN band gap is narrower (3.4 eV as opposed to 3.9 eV for $LiNbO_3$), the one-photon effect is dominant throughout the visible region, and the observable gated response shifted to longer wavelengths. Thus the gating beam intensity was reduced to 0.1 W/mm2. Other conditions were identical to those described above. At a 915 nm reference beam wavelength, the gated diffraction efficiency η was 0.7%, while at 995 nm, that efficiency had dropped to about 0.1%. Further, at 915 nm, the enhancement factor (the ratio of two-color to one-color diffraction efficiencies) was greater than 300. It should be noted that the 514.5 nm gating beam produces a rather large one-photon photorefractive effect, and hence is not an optimal gating wavelength for SBN. Given SBN's band gap, a gating beam of about 630 nm or larger would produce many fewer single photon transitions and would therefore be more appropriate for two photon transitions.

Example 4

Experiments were also performed with a barium titanate crystal supplied by Virgo Optics of Port Richie, Fla. Under identical conditions used with SBN, a gated diffraction efficiency of approximately 0.1% was obtained at 915 nm, which represents an enhancement factor about 20. The band gap of this crystal is only 3.1 eV. The optimal gating wavelength is thus estimated to be greater than 690 nm.

4. Conclusion

Although the foregoing invention has been described in some detail for purposes of clarity of understanding, it will be apparent that certain changes and modifications may be practiced within the scope of the appended claims. For instance, although the specification has described holographic photorefractive memory, the ferroelectric materials of this invention will be useful in all photorefractive applications involving signal processing, routing, switching, and optical interconnections (see, for example, "Selected Papers on Optical Computing" SPIE Milestone Series, H. John Caulfield and Gregory Gheen, editors, SPIE Optical Engineering Press, 1989, which is incorporated herein by reference for all purposes). In addition, the reader will understand that varying certain recording conditions may require a corresponding adjustment in certain of the above discussed parameters. For example, increasing the temperature of the ferroelectric recording medium will decrease the lifetime of the medium's intermediate states. Thus, the time frame in which a write pulse must follow a gating pulse will have to be decreased by a corresponding amount.

What is claimed:

1. A method of writing to a holographic recording medium containing a ferroelectric material that contains no more than about 0.01% atomic of an optically active impurity, the method comprising the following steps:
    separating a first radiation beam of a first wavelength into a reference beam and an object beam;
    spatially modulating the object beam to produce a spatially modulated object beam;
    combining the reference beam and the spatially modulated object beam to form an interference pattern on a first region of said holographic recording medium; and
    directing a gating radiation beam containing at least a second wavelength onto a second region at least partially coextensive with said first region of the holographic recording medium,
    whereby photons of the first and second wavelengths together promote electrons or holes of the holographic recording media to a conduction band or a valence band, respectively, by a two-photon process such that the interference pattern is recorded in said holographic recording medium,
    wherein at least one of the first radiation beam and the gating radiation beam is produced by a laser at an intensity of at most about 1000 watts/cm$^2$,
    wherein said two-photon process employs intermediate states that are defects in the ferroelectric material, which intermediate states may be populated with said electrons or holes excited by radiation over at least a 50 nm range of wavelengths in the electromagnetic spectrum, and
    wherein said first and second wavelengths are not in resonance with said optically active impurity.

2. The method of claim 1 wherein the the laser is a continuous wave laser.

3. The method of claim 1 wherein the laser provides radiation at an intensity of between about 20 and 200 watts/cm$^2$.

4. The method of claim 1 wherein the first radiation beam is produced by a continuous wave laser.

5. The method of claim 1 wherein the gating radiation beam is produced by a continuous wave laser.

6. The method of claim 1 wherein the ferroelectric material contains no more than about 10 parts per million of optically active impurity.

7. The method of claim 1 wherein the ferroelectric material is selected from the group consisting of lithium niobate, potassium lithium niobate, lithium tantalate, barium titanate, strontium barium niobate, lead barium niobate, and barium strontium potassium sodium niobate.

8. The method of claim 1 wherein the ferroelectric material has been subjected to a reduction process to introduce oxygen vacancies in the ferroelectric material.

9. The method of claim 1 wherein the ferroelectric material is doped with an optically inactive dopant, thereby providing defects in the ferroelectric material.

10. The method of claim 1 wherein the first and second wavelengths are different from one another.

11. The method of claim 10 wherein said second wavelength is shorter than said first wavelength.

12. The method of claim 1 further comprising a step of erasing the recorded interference pattern.

13. The method of claim 12 wherein the step of erasing is performed by focusing radiation of the second wavelength onto the recorded interference pattern.

14. The method of claim 12 wherein the step of erasing is performed by focusing white light onto the recorded interference pattern.

15. The method of claim 1 wherein the first radiation beam and the gating radiation beam are pulsed, and wherein the gating radiation beam pulses precede the first radiation beam pulses by no more than about the lifetime of an intermediate state of the holographic recording medium.

16. The method of claim 15 wherein the gating radiation pulse precedes the first radiation pulse by no more than about 30–50 milliseconds.

17. The method of claim 1 wherein the first radiation beam is produced by a diode laser.

18. The method of claim 1 wherein the gating radiation beam is produced by a diode laser.

19. The method of claim 1 wherein the gating radiation beam is produced by an incoherent radiation source.

20. The method of claim 1 wherein the first radiation beam is a coherent monochromatic radiation beam of a wavelength within the red or infrared regions of the electromagnetic spectrum.

21. The method of claim 1 wherein the first and second wavelengths are the same.

22. The method of claim 1 wherein photons of the first radiation beam have a first defined photon energy and at least some photons of the gating radiation beam have at least a second defined photon energy, and wherein the sum of the first and second defined photon energies is at least as great enough to promote the electrons or holes into the conduction or valence bands respectively, but neither the first nor the second defined photon energies alone is great enough to promote electrons or holes into the conduction or valence bands respectively.

* * * * *